United States Patent
Hastings

(10) Patent No.: US 6,429,723 B1
(45) Date of Patent: Aug. 6, 2002

(54) INTEGRATED CIRCUIT WITH CHARGE PUMP AND METHOD

(75) Inventor: Roy A. Hastings, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/658,776

(22) Filed: Sep. 11, 2000

Related U.S. Application Data

(60) Provisional application No. 60/166,522, filed on Nov. 18, 1999.

(51) Int. Cl.[7] .................................................. G05F 3/16
(52) U.S. Cl. ........................ 327/536; 327/537; 363/60
(58) Field of Search ................................ 327/535, 536, 327/537; 363/59, 60; 307/110

(56) References Cited

U.S. PATENT DOCUMENTS

| | | | | |
|---|---|---|---|---|
| 4,956,814 A | * | 9/1990 | Houston ..................... | 365/154 |
| 5,546,026 A | * | 8/1996 | Lin et al. ..................... | 327/57 |
| 5,796,651 A | * | 8/1998 | Horne et al. ................. | 365/154 |
| 6,107,864 A | * | 8/2000 | Fukushima et al. ......... | 327/536 |

OTHER PUBLICATIONS

Streetman, Ben G., *Solid State Electronic Devices*, 2nd Ed., Prentice–Hall, Inc., 1980, pp. 336–338 and 346–347.*

* cited by examiner

*Primary Examiner*—Timothy P. Callahan
*Assistant Examiner*—Terry L. Englund
(74) *Attorney, Agent, or Firm*—W. Daniel Swayze, Jr.; W. James Brady; Frederick J. Telecky, Jr.

(57) ABSTRACT

An integrated circuit comprises a first node (11) and a first stage charge pump (510) coupled to the first node (11) and to load circuitry (520). The first stage charge pump comprises a first capacitor (C1) coupled to a first signal source ($\phi_1$), a second capacitor (C2) coupled to a second signal source ($\phi_2$), a drain (24) of a first n-channel field effect transistor (MN1) coupled to the first capacitor (C1), and a source (20) of the first n-channel field effect transistor (MN1) coupled to the first node (11). A source (36) of a first p-channel field effect transistor (MP1) couples to a second node (12) and a gate (34) of the first p-channel field effect transistor (MP1) couples to the second capacitor (C2). The gate (34) and drain (32) of the first p-channel transistor (MP1) couple to the gate (22) and drain (24) of the first n-channel transistor (MN1), respectively. The charge pump (510) comprises a source (26) of a second n-channel field effect transistor (MN2) coupled to the first node (11) and a gate (28) of the second n-channel transistor (MN2) coupled to the first capacitor (C1). A source (42) of a second p-channel field effect transistor (MP2) couples to the second node (12), and a drain (38) of the second p-channel transistor (MP2) is coupled to the second capacitor (C2). The gate (40) and drain (38) of the second p-channel transistor (MP2) couple to the gate (28) and drain (30) of the second n-channel transistor (MN2), respectively.

20 Claims, 2 Drawing Sheets

INTEGRATED CIRCUIT WITH CHARGE PUMP AND METHOD

This application claims priority under 35 USC §119(e)(1) of provisional application No. 60/166,522 filed Nov. 18, 1999.

RELATED APPLICATION

This patent application is related to co-pending U.S. application entitled INTEGRATED CIRCUIT WITH CURRENT LIMITED CHARGE PUMP AND METHOD, Ser. No. 09/705,355 filed Nov. 3, 2000.

TECHNICAL FIELD OF THE INVENTION

This invention relates generally to the field of integrated circuits and more particularly to integrated circuits having a charge pump.

BACKGROUND OF THE INVENTION

A charge pump may be any two-port circuit that transforms electrical energy supplied to an input port at one voltage level into electrical energy delivered to an output port at a second voltage level. Many charge pumps contain at least one capacitor and at least two switches coupled together so that periodic operation of the switches alternately charges and discharges the capacitor(s) and transfers energy from the input port to the output port.

Because charge pumps ordinarily do not contain inductive elements (except as parasitic elements), the change transfer process is inherently dissipative. The energy efficiency of the pump equals the ratio of the energy delivered by the charge pump to the load divided by the energy supplied to the charge pump.

Many charge pumps are designed to provide an output voltage larger than their input voltage. A charge pump of this type will provide the maximum possible output voltage when unloaded. A charge pump whose maximum possible output voltage equals twice the input voltage is called a doubler; one whose maximum possible output voltage equals thrice its input voltage is called a tripler, and so forth. Because of the effects of output loading, and because of parasitic losses within the pump, charge pumps rarely, if ever, supply their full theoretical output voltage. For charge pumps with an output voltage larger than the input voltage, the voltage conversion efficiency (or voltage efficiency) of a charge pump may be defined as the ratio of the actual output voltage of the pump divided by the maximum output voltage of an unloaded idealized version of the pump.

Many practical charge pumps use diodes to implement one or more switches.

The forward voltage drops of these diodes reduce the charge pump's voltage efficiency. Integrated diodes may also suffer from parasitic transistor action due to minority carrier injection that diverts a portion of the current flowing through them to the substrate, causing a further loss in energy efficiency.

In order to avoid the limitations of diode-based charge pumps, some charge pumps use MOSFET transistors to implement some or all of the switches. Gate drive circuitry generally complicates these circuits to an undesirable degree. The gate drive circuitry also draws energy from the pump, reducing its overall energy efficiency.

SUMMARY OF THE INVENTION

One aspect of the invention is an integrated circuit comprising a first node and a first stage charge pump coupled to the first node and to load circuitry. The first stage charge pump comprises a first capacitor coupled to a first signal source, a second capacitor coupled to a second signal source, a drain of a first n-channel field effect transistor coupled to the first capacitor, and a source of the first n-channel field effect transistor coupled to the first node. A source of a first p-channel field effect transistor is coupled to a second node and a gate of the first p-channel field effect transistor is coupled to the second capacitor. The gate and drain of the first p-channel transistor are coupled to the gate and drain of the first n-channel transistor, respectively. The charge pump also comprises a source of a second n-channel field effect transistor coupled to the first node, a drain of the second n-channel field effect transistor coupled to the second capacitor, and a gate of the second n-channel transistor coupled to the first capacitor. A source of a second p-channel field effect transistor is coupled to the second node, and a drain of the second p-channel transistor is coupled to the second capacitor. The gate and drain of the second p-channel transistor are coupled to the gate and drain of the second n-channel transistor, respectively.

The invention provides several important technical advantages. Various embodiments of the invention may have none, some, or all of these advantages. The invention may improve the voltage and energy efficiency compared to existing charge pumps. The invention avoids the forward voltage drop and minority carrier injection problems of typical diode designs. Further, the invention may be used at high frequencies with minimal voltage and/or energy efficiency losses. The invention may also reduce the die area required to implement the charge pump. The invention also may reduce energy and voltage efficiency losses due to parasitic capacitance in existing designs. The invention also allows the construction of multi-stage charge pumps using relatively low-voltage transistors. The invention can also be used to step down the input voltage to provide a lower output voltage, step up the voltage, or to invert the polarity of the input voltage.

BRIEF DESCRIPTION OF THE DRAWINGS

For a more complete understanding of the present invention and the advantages thereof, reference is now made to the following descriptions taken in connection with the accompanying drawings in which.

DETAILED DESCRIPTION OF THE DRAWINGS

The present invention and its advantages are best understood by referring to FIGS. 1 through 8 of the drawings, like numerals being used for like and corresponding parts of the various drawings.

Figure 1:
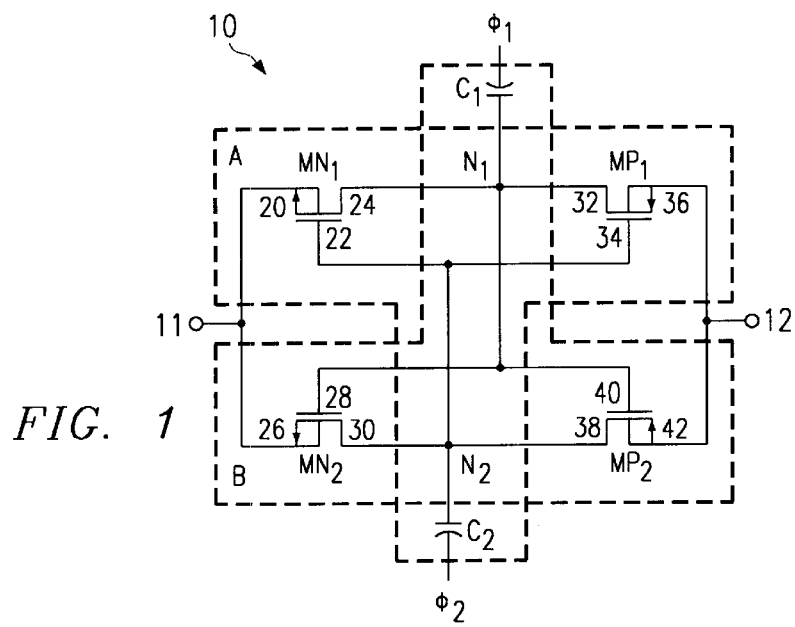
FIG. 1 illustrates a schematic diagram of one embodiment of a charge pump constructed in accordance with the present invention.

FIG. 1 illustrates a schematic diagram of one embodiment of a charge pump. Charge pump 10 comprises two n-channel field effect transistors MN1 and MN2, two p-channel field effect transistors MP1 and MP2, and two capacitors C1 and C2 operable to couple to two signal sources $\phi_1$ and $\phi_2$. These components couple first node 11 of charge pump 10 to second node 12 of charge pump 10.

Charge pump 10 comprises two generally symmetric half cells A and B. Each half cell comprises one n-channel transistor, one p-channel transistor, and a capacitor. In each half cell, the gate and drain of the n-channel transistor are coupled to the gate and drain of the p-channel transistor, respectively. The drains are coupled to one capacitor while the gates are coupled to another capacitor from the other half-cell. Each capacitor is coupled to its associated signal source. The source of the n-channel transistor is coupled to first node 11, and the source of the p-channel transistor is coupled to second node 12. In this embodiment, half-cell A comprises MN1, MP1, and C2, and half-cell B comprises MN2, MP2, and C1.

Any suitable field effect transistors, such as MOSFETS, may be used. To minimize the effective-on-resistances of transistors MP1, MP2, MN1 and MN2, it is desirable that the backgate of each transistor connect to its source. The backgates of transistors MP1 and MP2 should be isolated from the backgates of transistors MN1 and MN2. Any suitable method of isolation can be used, such as the junction isolation schemes discussed in further detail in conjunction with FIGS. 2 and 3. Other isolation techniques may also be employed in order to accommodate manufacturing needs.

Capacitors C1 and C2 may be any suitably-sized capacitors. In cases where capacitors C1 or C2 are created by a process wherein one electrode of the capacitor has a larger parasitic coupling capacitance than the other electrode, it is desirable to connect the electrode having the larger parasitic capacitance to the associated signal source, rather than coupling it to the associated transistors. Such a configuration reduces charge injection from internal nodes of the charge pump into the substrate, thus improving the overall energy efficiency of charge pump 10.

Signal sources $\phi_1$ and $\phi_2$ may be any suitable signal sources that are approximately 180 degrees out of phase. In one embodiment, signal sources $\phi_1$ and $\phi_2$ are two square wave signals having equal peak-to-peak voltages $V_\phi$ and duty cycles of approximately 50%. Other signal sources may be also used within the scope of the invention.

When operated without a significant load current being drawn from second node 12, charge pump 10 generates a voltage at second node 12 that is equal to the sum of the peak-to-peak voltage $V_\phi$ of $\phi_1$ and the voltage ($V_{in}$) applied to first node 11. Charge pump 10 thus operates to step up the voltage $V_{in}$ applied to first node 11 by a voltage $V_\phi$ provided by signal sources $\phi_1$ and $\phi_2$. The charge pump may also be operated to step down the voltage $V_{in}$ by a voltage $V_\phi$ by connecting voltage $V_{in}$ to second node 12 and by connecting the load to first node 11. For example, if voltage $V_{in}$ equals zero volts (ground potential), then the voltage generated at first node 11 will be negative, and charge pump 10 acts to invert voltage $V_{in}$.

When signal sources $\phi_1$ and $\phi_2$ are disabled, internal nodes N1 and N2 charge through the first and second back gates of transistors MN1 and MN2 respectively, to approximately equal input voltage $V_{in}$ applied to first node 11. Similarly, second node 12 charges through the back gates of transistors MP1 and MP2 to approximately equal voltage $V_{in}$. When clock $\phi_1$ rises from zero volts to $V_\phi$ while the other clock $\phi_2$ remains at zero volts, the voltage at node N1 rises from $V_{in}$ to a summed voltage $V_\phi + V_{in}$. Because half cell B is driven by first clock $\phi_1$, the gate-source voltage, $V_{gs}$, of transistor MN2 increases from zero volts to $V_\phi$, causing transistor MN2 to conduct. Additionally, $V_{gs}$ for transistor MP2 increases from zero volts to $V_\phi$ and thus transistor MP2 is not conducting. Node N2 is thus connected to first node 11 and may charge to approximately equal voltage $V_{in}$, First node 11 also transfers charge to capacitor C2.

When clock $\phi_1$ falls from $V_{in}$ to zero volts, approximately simultaneously clock $\phi_2$ rises from zero volts to $V_{in}$. The voltage on node N2 rises from $V_{in}$ to $V_{in}+V_\phi$. Approximately simultaneously, the voltage on node N1 falls from $V_{in}+V_\phi$ to $V_{in}$. The gate-to-source voltage $V_{gs}$ across transistor MN2 falls from $V_\phi$ to $-V_\phi$, and transistor MN2 ceases to conduct. The gate-to-source voltage $V_{gs}$ across transistor MP2 approximately simultaneously falls from $V_\phi$ to $-V_\phi$, and transistor MP2 begins to conduct. Thus, the voltage $V_{in}+V_\phi$ on node N2 is coupled to second node 12 through transistor MP2, and charge is transferred from capacitor C2 to the load coupled to second node 12. When clocks $\phi_1$ and $\phi_2$ change phase, current flow through half cells A and B is reversed. For example, when clock $\phi_1$ is high and clock $\phi_2$ is low, capacitor C2 is charged from first node 11 through transistor MN2, and capacitor C1 discharges to second node 12 through transistor MP1. When clock $\phi_1$ is low and clock $\phi_2$ is high, capacitor C1 is charged from first node 11 through transistor MN1, and capacitor C2 discharges to second node 12 through transistor MP2. Thus, second node 12 is constantly charged by one of the capacitors C1 or C2, and if the charge pump is not heavily loaded and the circuit has had time to reach steady state, second node 12 is not subjected to large voltage swings. Charge pump 10 may also operate similarly in reverse to step down the voltage from second node 12 to first node 11, in which case charge is transferred from first node 11 to second node 12 in the manner above described.

Typically, the amount of current that may be provided to second node 12 for any given output voltage between $V_{in}$ and $V_{in}+V_\phi$ is proportional to the frequency of signal sources $\emptyset_1$ and $\emptyset_2$. This output current is also proportional to the sum of the capacitance of capacitors C1 and C2. Capacitors C1 and C2 may be equal in value. In some embodiments, it may be desirable for one capacitor to be significantly larger in value than the other. Charge pump 10 may also operate at a higher frequency in order to compensate for lower capacitance values C1 and C2.

Figure 2:
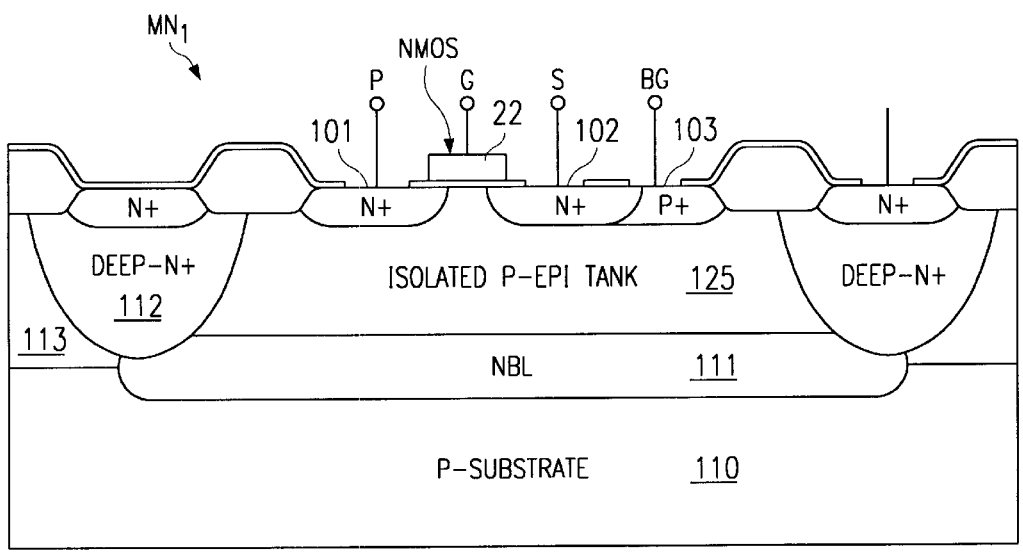
FIG. 2 illustrates a cross section of one embodiment of an n-channel transistor used in one embodiment of the charge pump of FIG. 1.

FIG. 2 illustrates a cross section of one embodiment of an n-channel transistor that may be used in the charge pump of FIG. 1. In this embodiment, an n-channel transistor, such as MN1, comprises a junction isolated NMOS transistor such as may be formed in an N-well BiCMOS process. NMOS transistor MN1 may be formed by two shallow heavily doped N-type diffusions (N+ diffusions) 101, 102 in a P-type epitaxial region (P-epi) 125. In this embodiment, source 20 of transistor MN1 comprises N+ diffusion 102, and drain 24 comprises N+ diffusion 101.

Figure 4:
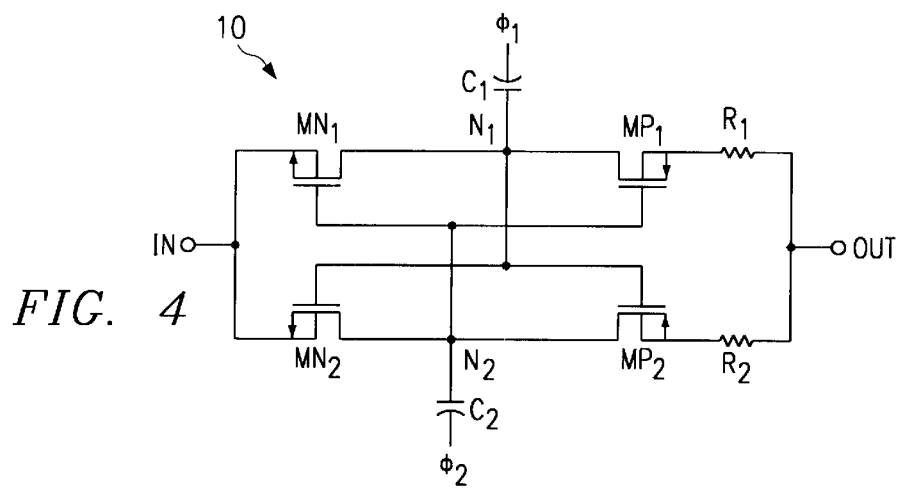
FIG. 4 illustrates a schematic diagram of another embodiment of a charge pump constructed in accordance with the present invention.

In this embodiment, the back gate of transistor MN1 comprises a P-epi region 125, which may be contacted by a shallow heavily doped P-type diffusion 103 abutting source 102. A PN-junction formed between regions 102 and 103 may create excessive current leakage. To eliminate this leakage, source 102 and back gate 103 may be coupled together electrically, as shown in FIG. 4. The PN-junction between back gate P-epi region 125 and drain N+ diffusion 101 forms a parasitic back gate diode which may be biased into conduction if the source voltage exceeds the drain voltage by more than a few tenths of a volt. Forward-biasing the drain-backgate junction injects minority carriers (electrons) into the P-epi, some of which traverse to the isolation. This current flow represents a loss of charge from the charge pump circuit and reduces the energy efficiency of the charge pump.

Effective isolation techniques may be used to improve the efficiency of charge pump 10 by eliminating back gate modulation which would otherwise occur if the back gates of NMOS transistors MN1 and MN2 were connected to the substrate.

The isolated NMOS configuration illustrated in FIG. 2 may also use an additional combination of N-buried layer 111 (or NBL) and deep N+ sinker 112 (or alternatively, an N-well) as an isolation "ring" to isolate the section of P-epi forming the back gate of the transistor. The NBL severs the isolated P-epi tank 125 from the P-substrate 110 beneath, and the deep N+ sinker ring isolates it from adjacent P-epi region 113. In order to create effective isolation, such a ring contains no gaps and the NBL overlaps it sufficiently to allow for misalignment. Such an isolation ring is generally connected to a voltage equal to, and generally not greater than, that applied to the isolated P-epi tank to avoid "punch through" from the drain N+ diffusion through the lightly doped epi. This isolation technique may improve the voltage efficiency of charge pump 10 by minimizing voltage drops across the MOS transistors (due to the diminution of back-gate modulation effects and the consequent reduction in effective gate drive voltage), and may improve energy efficiency by blocking minority carrier flow to the substrate, thereby minimizing parasitic transistor action. N-channel transistors MN1 and MN2 may also be oxide-isolated. Many manufacturing methods for oxide or dielectric isolation are known to the industry.

Figure 3:
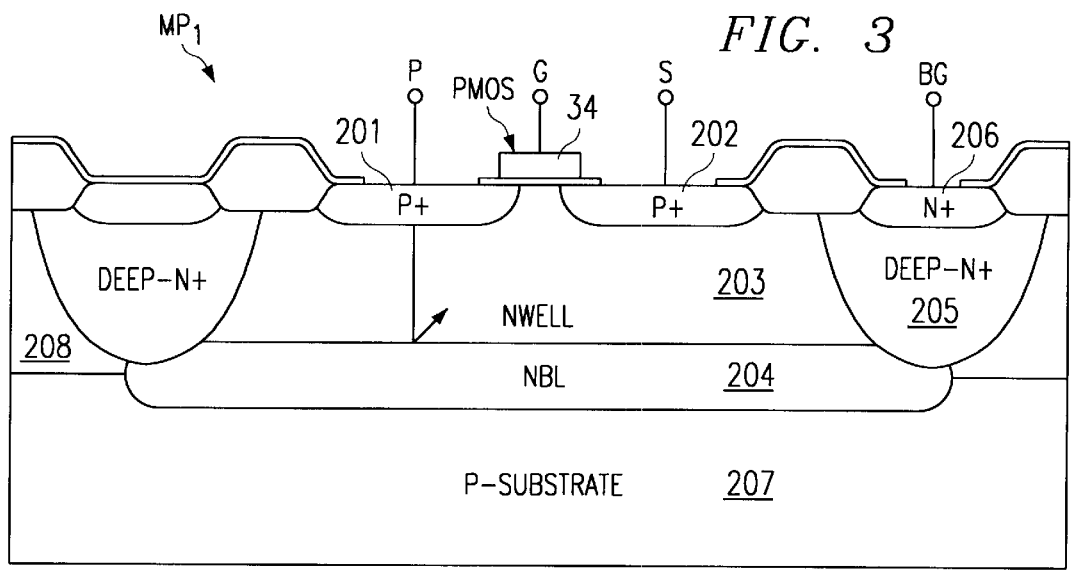
FIG. 3 illustrates a cross section of one embodiment of a p-channel transistor used in one embodiment of the charge pump of FIG. 1.

FIG. 3 illustrates a cross section of one embodiment of a p-channel transistor, such as MP1, that may be used in the charge pump of FIG. 1. A p-channel transistor comprises an isolated PMOS transistor such as may be formed in an N-well BiCMOS process. PMOS transistor MP1 may be formed by two shallow, heavily doped P-type diffusions or P+ diffusions 201, 202 in a deep, lightly doped N-well diffusion. In this embodiment, source 36 of transistor MP1 comprises P+ diffusion 201, and drain 32 comprises P+ diffusion 202. P-channel transistors MP1 and MP2 may also include oxide or dielectric isolation without departing from the scope of the invention.

In this embodiment, the back gate of transistor MP1 comprises an N-well diffusion 203, which is terminated upon its bottom surface by N-buried layer (NBL) 204, and upon all sides by a ring of deep-N+ sinker diffusion 205. The backgate is coupled via a shallow N+ diffusion 206 residing within, and electrically coupled to, the deep-N+ sinker 205. The NBL layer 204 resides at the interface between a lightly doped P-type epitaxial layer (P-epi) 208 deposited upon a lightly doped P-type substrate 207. The back gate of transistor MP1, comprising N-type regions 203, 204, 205, and 206, is electrically isolated from the P-epi 208 and P-substrate 207 by a reverse-biased PN-junction.

The PN-junction between drain diffusion 201 and N-well 203 may be biased into conduction when the back gate voltage exceeds the drain voltage by more than a few tenths of a volt. For example, in FIG. 4, the source and backgate are electrically common, and the PN-junction between the drain and backgate of transistor MP1 as illustrated in FIG. 4 will become forward-biased if the source voltage exceeds the drain voltage by more than a few tenths of a volt.

Deep-N+ sinker 205 and NBL 204 may be used to minimize current loss to the substrate through parasitic substrate PNP transistor action. For example, deep-N+ sinker 205 and NBL 204 may repel minority carriers back into the N-well (due to the built-in potential and consequent electric field present at the N+/N− interface). Any minority carriers that surmount the electrical potential across the N+/N− interface may recombine in the heavily doped deep-N+ sinker or NBL before they can reach the P-epi or P-substrate. The deep-N+ sinker and NBL may reduce the escape of minority carriers from the N-well, and thereby reduce parasitic transistor action and concomitant loss of current to the substrate.

FIG. 4 illustrates a schematic diagram of another embodiment of a charge pump constructed in accordance with the present invention. This embodiment of charge pump 10 comprises resistors R1 and R2, in addition to the elements comprising the embodiment as shown in FIG. 1. Resistor R1 couples source 36 of transistor MP1 to second node 12. Similarly, resistor R2 couples source 42 of transistor MP2 to second node 12.

Such resistors typically limit the voltage drop encountered across the parasitic back gate diodes of each of the transistors, and prevent such diodes from conducting. The use of such resistors thus may improve the voltage and energy efficiency of a charge pump by limiting losses due to parasitic transistor action and loss of current to the substrate. One example for such an implementation includes utilizing standard BiCMOS processes with junction isolation, with or without the additional isolation rings as shown and discussed in conjunction with FIG. 3.

Resistors R1 and R2 are in series with each p-channel transistor MP1 and MP2. Other means for providing equivalent resistance are known to those skilled in the art. For example, resistors R1 and R2 may be manufactured within each transistor MP1 and MP2. Additional resistors R3 and R4 (not explicitly shown) may also similarly couple the source of transistor MN1 and the source of transistor MN2 to first node 11 without departing from the scope of the invention.

Figure 5:
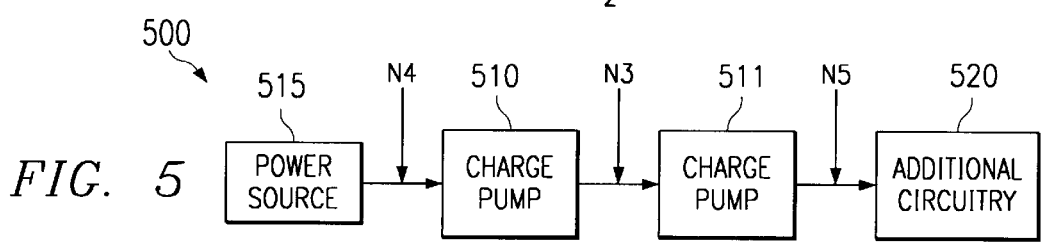
FIG. 5 illustrates a block diagram of a multi-stage charge pump constructed in accordance with the present invention.

FIG. 5 illustrates a block diagram of a multi-stage charge pump constructed in accordance with the present invention. Charge pump 500 is connected between a first node N4, fed by a power source 515, and a second node N5, which is coupled to additional circuitry 520. Cascading a plurality of charge pumps 510, 511 enables higher voltages to be achieved than in a single stage charge pump. Charge pump 500 may utilize alternative schemes to couple charge pumps 510 and 511 to step up the input voltage at node N4 to produce a larger voltage at node N5, or to step down the input voltage to produce a smaller (or more negative) output voltage. As an input, power source 515 may comprise any suitable source of electrical energy, such as a voltage source or a battery. Additional circuitry 520 may be any type of circuitry, whether analog or digital.

Charge pumps 510, 511 may be of the type illustrated in FIG. 1, and provide a step-up in voltage between power source 515 and node N5. In that case, first charge pump 510 provides an output voltage on node N3 of $V_{in}+V_\phi$, and on output node N5, a voltage of $V_{in}+V_\phi+V_\phi$. Any number of charge pump stages may be included without departing from the scope of the invention.

Each charge pump 510, 511 may be configured with capacitor values C1 and C2 as discussed in conjunction with FIG. 1. Each charge pump 510, 511 may operate independently. For example, independent signal sources $\phi_1$ and $\phi_2$ may comprise peak-to-peak voltages, duty cycles, phase relationships and/or frequencies of operation that may vary from one charge pump to the other. Furthermore, charge pumps 510, 511 may or may not be configured identically.

Transistors MN1, MN2, MP1, and MP2 as used in each charge pump 510, 511 may be isolated as described in conjunction with FIGS. 2 and 3. The back gates used in transistors MN1, MN2, MP1 and MP2 are isolated independently between charge pumps 510, 511.

Figure 6:
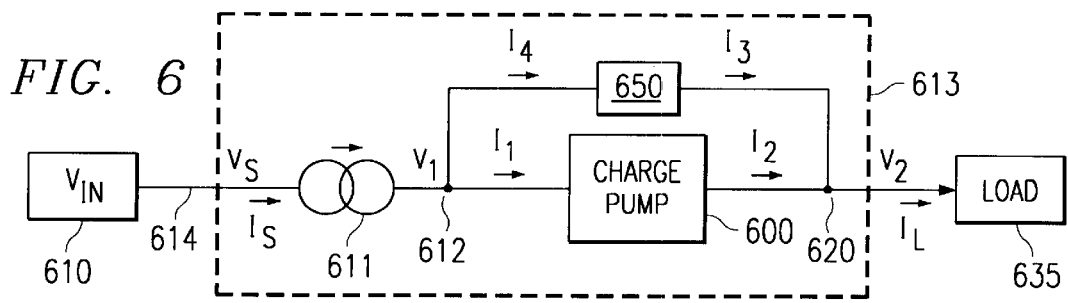
FIG. 6 illustrates a schematic diagram of a current-limited charge pump constructed in accordance with the present invention.

FIG. 6 illustrates a schematic diagram of a current-limited charge pump 613 constructed in accordance with the present invention. Current-limited charge pump 613 comprises a current source 611 coupled between voltage source 610 and a first node 612 that limits a current Is drawn from voltage source 610 into node 612. Current-limited charge pump 613 further comprises charge pump 600 coupled to and drawing current $I_1$ from first node 612, and coupled to and providing current $I_2$ to second node 620. Recirculation circuit 650 is also coupled to and provides a current $I_3$ to second node 620 and is also coupled to and draws a current 14 from first node 612. Current-limited charge pump 613 delivers a current $I_L$ to load 635. Charge pump 600 may provide a voltage $V_2$ to second node 620 that is less than or equal to a voltage $V_1$ at first node 612, or vice-versa. Currents $I_1$–$I_4$ flow from a higher voltage potential to a lower voltage potential, although illustrated in FIG. 6 as flowing from left-to-right. Any charge pump 600, including those discussed in conjunction with FIGS. 1–4, may be used without departing from the scope of the invention. As will be discussed in further detail below, charge pump 600, current source 611 and recirculation circuit 650 may combine to limit the current provided to load 635 to a known value. For example, current may be limited to no more than a maximum current provided by current source 611, and to no less than a minimum current provided by charge pump 600.

In general, a charge pump 600 provides an output current $I_2$ limited by the values of its internal capacitors, the frequencies at which its switches are operated, and the magnitudes of the voltage (and current) losses within these switches. Furthermore, current $I_2$ may vary drastically depending upon the voltage differential across the charge pump. On the other hand, charge pump 613, which comprises current source 611 and recirculation circuit 650, may minimize variations in load current $I_L$ caused by variations in charge pump output current $I_2$.

To illustrate the operation of charge pump 613, consider a charge pump 600 that receives a voltage $V_1$ from first node 612 and provides a higher voltage $V_2$ to second node 620, and where the current $I_1$ drawn by charge pump 600 from first node 612 approximately equals the current $I_2$ delivered by charge pump 600 to second nod[0085] 620. Where voltage $V_1$ is less than $V_2$, which is less than the voltage $V_s$ delivered by voltage source 610, current source 611 limits current $I_S$ to first node 612. By Kirchoff's current law, $I_S=I_1+I_4$, and $I_L=I_2+I_3$. In the embodiment currently under discussion for charge pump 600 and recirculation circuit 650, $I_2$ approximately equals $I_1$, while $I_4$ approximately equals $I_3$, and thus $(I_2+I_3)$ approximately equals $(I_1+I_4)$, and $I_L$ approximately equals $I_S$. In this embodiment, charge pump 613 limits the current $I_L$ provided to load 635 to approximately $I_S$.

As charge pump 600 draws current $I_1$ from first node 612 and delivers current $I_2$ to second node 620, current $I_1$ may exceed the current $I_S$ provided by current source 611, and voltage $V_1$ on first node 612 will begin dropping. Without recirculation circuit 650, voltage $V_1$ may drop low enough to impair proper operation of charge pump 600 and current source 611, by (for example) forward-biasing isolation junctions. Recirculation circuit 650 may desirably avoid this situation by conducting current from second node 620 to first node 612 when voltage $V_1$ at first node 612 drops below a threshold value. Because $(I_2+I_3)$ is approximately equal to $(I_1+I_4)$, load current $I_L$ should approximately equal current $I_S$.

As voltage $V_2$ further increases, the voltage differential $(V_2-V_1)$ across charge pump 600 increases and the amount of current $I_1$ that it draws diminishes, eventually to a value below $I_S$. Voltage $V_1$ on first node 612 rises until it approaches voltage $V_s$ delivered by voltage source 610. The voltage differential $(V_s-V_1)$ across current source 611 decreases sufficiently that current source 611 cannot deliver its full rated current, and $I_S$ decreases to match $I_1$.

In embodiments where charge pump 600 draws a current $I_1$ unequal to current $I_2$, recirculation circuit 650 should operate to provide a ratio $I_3/I_4$ that is approximately equal to the ratio $I_2/I_1$, or N. In this embodiment, $(I_2+I_3)$ is approximately $N*(I_1+I_4)$, and $I_L$ is approximately $N*I_S$, regardless of the relative magnitudes of $I_1$ and $I_4$.

For step-up charge pumps whose unloaded output voltage $V_2$ asymptotically approaches a value larger than their input voltage $V_1$, it may be desirable for recirculation circuit 650 to provide the following relationships:

(1) when $V_2 > V_1$ and $V_1 > V_{thres}$, then $I_4$ approximately=$I_3$ approximately=0;

(2) when $V_2 > V_1$ and $V_1 < V_{thres}$, then $I_4$ approximately= $I_3/N$; and (3) when $V_2 <= V_1$, then $I_4$ approximately=$I_3/N$, or $I_4$ approximately=0.

In these equations, $V_{thres}$ represents a lower bound on voltage $V_1$ chosen to ensure proper operation of current limited charge pump 613, and N approximately equals the ratio of charge pump output current $I_2$ to charge pump input current $I_1$.

Similarly, for step-down charge pumps whose unloaded output voltage $V_2$ asymptotically approaches a value smaller than their input voltage $V_1$, it may be desirable for recirculation circuit 650 to provide the following relationships:

(1) when $V_2 < V_1$ and $V_1 < V_{thres}$, then $I_4$ approximately=$I_3$ approximately=0;

(2) when $V_2 < V_1$ and $V_1 > V_{thres}$, then $I_4$ approximately= $I_3/N$; and (3) when $V_2 >= V_1$, then $I_4$ approximately=$I_3/N$ or $I_4$ approximately=0.

In these equations, $V_{thres}$ represents an upper bound on voltage $V_1$ chosen to ensure proper operation of current limited charge pump 613, and N approximately equals the ratio of charge pump output current $I_2$ to charge pump input current $I_1$.

Figure 7:
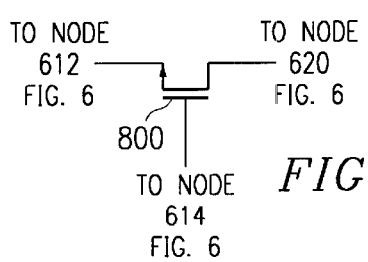
FIG. 7 illustrates an exemplary recirculation circuit for a step-up charge pump utilizing the teachings of the present invention.

FIG. 7 illustrates an exemplary recirculation circuit 650 for a step-up charge pump 600, utilizing the teachings of the present invention. In this implementation, recirculation circuit 650 comprises an NMOS transistor 800 whose source couples to first node 612, whose drain couples to second node 620 and whose gate couples to the output of voltage source 610 at node 614. When $V_2 <= V_1$, $V_1$ is also less than $V_s$, and NMOS transistor 800 conducts current from first node 612 to second node 620. Because the ratio of drain current to source current will approximately equal one, recirculation circuit 650 may be used with charge pumps whose output current approximately equals their input current.

When $V_2>V_1$, transistor 800 conducts current from second node 620 to first node 612 when voltage $V_1$ at first node 612 is less than $(V_s-V_t)$, where $V_t$ is the threshold voltage of NMOS transistor 800. An NPN transistor or any form of N-channel field effect transistor may be substituted for NMOS transistor 800. It is also within the scope of the invention for a step-down charge pump 600 to utilize a PMOS transistor, a PNP transistor or any form of P-channel field effect transistor instead of NMOS transistor 800.

Figure 8:
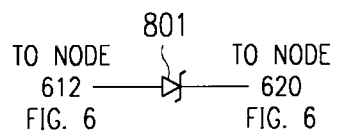
FIG. 8 illustrates another exemplary recirculation circuit utilizing the teachings of the present invention.

FIG. 8 illustrates another exemplary recirculation circuit 650 utilizing the teachings of the present invention. In this implementation, recirculation circuit 650 comprises an avalanche diode 801 whose anode couples to first node 612 and whose cathode couples to second node 620. This configuration may be used with step-up charge pumps 600 where output current $I_2$ is approximately equal to input current $I_1$.

When $V_2<V_1-V_f$, where $V_f$ is a forward voltage of the diode, diode 801 conducts current from first node 612 to second node 620. When $V_2>V_1$, diode 801 conducts current when $V_2>V_1+V_r$, where $V_r$ is the reverse breakdown voltage of diode 801. When the output of the charge pump is initially started from a voltage approximately equal to $V_s$, a diode 801 whose $V_r<V_s$ may prevent voltage $V_1$ from falling below zero, which may be desirable when charge pump 600 and current source 611 are constructed using junction isolation. As another example, for step-down charge pumps, the cathode of diode 801 may couple to first node 612 and the anode of the diode may couple to second node 620.

Use of cascaded charge pumps 600A, 600B (not explicitly shown) as a multi-stage charge pump may also be used to enable higher voltages to be obtained, as discussed in conjunction with FIG. 5. Recirculation circuit 650 may couple to nodes N4 and N5 as illustrated in FIG. 5, and cascaded charge pumps 600A, 600B may provide an output voltage on second node N5 of $V_{in}+V_\phi+V_\phi$. Any number of charge pump stages may be used without departing from the scope of the invention.

While the invention has been particularly shown and described by the foregoing detailed description, it will be understood by those skilled in the art that various other changes in form and detail may be made without departing from the spirit and scope of the invention.

What is claimed is:

1. A charge pump, comprising:
   a first capacitor coupled to a first signal source;
   a second capacitor coupled to a second signal source;
   a first n-channel field effect transistor comprising a first gate, a first drain coupled to the first capacitor, and a first source coupled to a first node;
   a first p-channel field effect transistor comprising a second source coupled to a second node, a second gate coupled to the second capacitor and to the first gate, and a second drain coupled to the first drain;
   a second n-channel field effect transistor comprising a third drain, a third source coupled to the first node, and a third gate coupled to the first capacitor;
   a second p-channel field effect transistor comprising a fourth source coupled to the second node, a fourth drain coupled to the second capacitor and to the third drain, and a fourth gate coupled to the third gate;
   a first resistor coupling the source of the first p-channel transistor to the second node; and
   a second resistor coupling the source of the second p-channel transistor to the second node.

2. A charge pump, comprising:
   a first capacitor coupled to a first signal source;
   a second capacitor coupled to a second signal source;
   a first n-channel field effect transistor comprising a first gate, a first drain coupled to the first capacitor, and a first source coupled to a first node;
   a first p-channel field effect transistor comprising a second source coupled to a second node, a second gate coupled to the second capacitor and to the first gate, and a second drain coupled to the first drain;
   a second n-channel field effect transistor comprising a third drain, a third source coupled to the first node, and a third gate coupled to the first capacitor;
   a second p-channel field effect transistor comprising a fourth source coupled to the second node, a fourth drain coupled to the second capacitor and to the third drain, and a fourth gate coupled to the third gate;
   a first resistor coupling the source of the first p-channel transistor to the second node; and
   a second resistor coupling the source of the second p-channel transistor to the second node.

3. The charge pump of claim 2, further comprising:
   a first back gate coupled to the source of the first n-channel transistor and to the first node;
   a second back gate coupled to the source of the second n-channel transistor and to the first node;
   a third back gate coupled to the source of the first p-channel transistor and to the second node; and
   a fourth back gate coupled to the source of the second p-channel transistor and to the second node.

4. A charge pump, comprising:
   a first capacitor coupled to a first signal source;
   a second capacitor coupled to a second signal source;
   a first n-channel field effect transistor comprising a first gate, a first drain coupled to the first capacitor, and a first source coupled to a first node;
   a first p-channel field effect transistor comprising a second source coupled to a second node, a second gate coupled to the second capacitor and to the first gate, and a second drain coupled to the first drain;
   a second n-channel field effect transistor comprising a third drain, a third source coupled to the first node, and a third gate coupled to the first capacitor;
   a second p-channel field effect transistor comprising a fourth source coupled to the second node, a fourth drain coupled to the second capacitor and to the third drain, and a fourth gate coupled to the third gate;
   a first back gate coupled to the source of the first n-channel transistor and to the first node;
   a second back gate coupled to the source of the second n-channel transistor and to the first node;
   a third back gate coupled to the source of the first p-channel transistor and to the second node;
   a fourth back gate coupled to the source of the second p-channel transistor and to the second node;
   a first resistor coupling the source of the first p-channel transistor to the second node; and
   a second resistor coupling the source of the second p-channel transistor to the second node.

5. The charge pump of claim 4, wherein the first and second n-channel transistors are isolated from the first and second p-channel transistors using reverse-biased PN-junctions.

6. The charge pump of claim 4, wherein the first and second n-channel transistors are isolated from the first and second p-channel transistors using an insulating dielectric.

7. An integrated circuit comprising:
a first stage charge pump coupled to a first node, the first stage charge pump comprising:
a first capacitor coupled to a first signal source;
a second capacitor coupled to a second signal source;
a first n-channel field effect transistor comprising a first gate, a first drain coupled to the first capacitor, and a first source coupled to the first node;
a first p-channel field effect transistor comprising a second source coupled to a second node, a second gate coupled to the second capacitor and to the first gate, and a second drain coupled to the first drain;
a second n-channel field effect transistor comprising a third drain, a third source coupled to the first node, and a third gate coupled to the first capacitor;
a second p-channel field effect transistor comprising a fourth source coupled to the second node, a fourth drain coupled to the second capacitor and to the third drain, and a fourth gate coupled to the third gate;
load circuitry coupled to the second node of the first stage charge pump;
a first resistor coupling the source of the first p-channel transistor to the load circuitry; and
a second resistor coupling the source of the second p-channel transistor to the load circuitry.

8. The integrated circuit of claim 7, further comprising a second stage charge pump operable to couple the first stage charge pump to the load circuitry.

9. The integrated circuit of claim 8, wherein the second stage charge pump comprises:
a third capacitor coupled to a third signal source;
a fourth capacitor coupled to a fourth signal source;
a third n-channel field effect transistor comprising a fifth gate, a fifth drain coupled to the third capacitor, and a fifth source coupled to the second node;
a third p-channel field effect transistor comprising a sixth source coupled to a third node, the third node coupled to the load circuitry, a sixth gate coupled to the fourth capacitor and to the fifth gate, and a sixth drain coupled to the fifth drain;
a fourth n-channel field effect transistor comprising a seventh drain, a seventh source coupled to the second node, and a seventh gate coupled to the third capacitor; and
a fourth p-channel field effect transistor comprising an eighth source coupled to the third node, an eighth drain coupled to the fourth capacitor and to the seventh drain, and an eighth gate coupled to the seventh gate.

10. The integrated circuit of claim 9, wherein the first and second n-channel transistors and the first and second p-channel transistors each comprise a MOSFET.

11. The integrated circuit of claim 7, wherein the first signal source produces a voltage waveform approximately 180° out of phase with the second signal source.

12. The integrated circuit of claim 7, further comprising:
a first back gate coupled to the source of the first n-channel transistor and to the first node;
a second back gate coupled to the source of the second n-channel transistor and to the first node;
a third back gate coupled to the source of the first p-channel transistor and to the load circuitry; and
a fourth back gate coupled to the source of the second p-channel transistor and to the load circuitry.

13. The integrated circuit of claim 7, wherein the first and second n-channel transistors are each isolated from the first and second p-channel transistors using reverse-biased PN-junctions.

14. The integrated circuit of claim 7, wherein the first and second n-channel transistors are isolated from the first and second p-channel transistors using an insulating dielectric.

15. An integrated circuit comprising:
a first stage charge pump coupled to a first node, the first stage charge pump comprising:
a first capacitor coupled to a first signal source;
a second capacitor coupled to a second signal source;
a first n-channel field effect transistor comprising a first gate, a first drain coupled to the first capacitor, and a first source coupled to the first node;
a first p-channel field effect transistor comprising a second source coupled to a second node, a second gate coupled to the second capacitor and to the first gate, and a second drain coupled to the first drain;
a second n-channel field effect transistor comprising a third drain, a third source coupled to the first node, and a third gate coupled to the first capacitor;
a second p-channel field effect transistor comprising a fourth source coupled to the second node, a fourth drain coupled to the second capacitor and to the third drain, and a fourth gate coupled to the third gate;
load circuitry coupled to the second node of the first stage charge pump;
a first resistor coupling the source of the first p-channel transistor to the load circuitry; and
a second resistor coupling the source of the second p-channel transistor to the load circuitry.

16. A method for making a charge pump, comprising:
coupling a first capacitor to a first signal source;
coupling a second capacitor to a second signal source;
coupling a source of a first n-channel field effect transistor and a source of a second n-channel field effect transistor to a first node;
coupling a drain of the first n-channel field effect transistor and a gate of the second n-channel field effect transistor to the first capacitor;
coupling a source of a first p-channel field effect transistor and a source of a second p-channel field effect transistor to a second node;
coupling the second capacitor to a gate of the first p-channel field effect transistor and a drain of the second p-channel field effect transistor;
coupling the gate of the first p-channel transistor to the gate of the first n-channel transistor, and the drain of the first p-channel transistor to the drain of the first n-channel transistor; and
coupling the gate of the second p-channel transistor to the gate of the second n-channel transistor, and the drain of the second p-channel transistor to the drain of the second n-channel transistor;
wherein the coupling to a second node comprises:
coupling with a first resistor the second node to a first back gate and the source of the first p-channel transistor; and
coupling with a second resistor the second node to a second back gate and the source of the second p-channel transistor.

17. The method of claim 16, wherein the coupling a first node further comprises:

coupling a first back gate and the source of the first n-channel transistor to the first node; and coupling a second back gate and the source of the second n-channel transistor to the first node.

18. The method of claim 16, wherein the first and second n-channel transistors and the first and second p-channel transistors each comprise a MOSFET.

19. The method of claim 16, wherein the first and second n-channel transistors are isolated from the first and second p-channel transistors using reverse-biased PN-junctions.

20. The method of claim 16, wherein the first and second n-channel transistors are each isolated from the first and second p-channel transistors using an insulating dielectric.

* * * * *